United States Patent [19]

Asano et al.

[11] Patent Number: 5,110,248
[45] Date of Patent: May 5, 1992

[54] VERTICAL HEAT-TREATMENT APPARATUS HAVING A WAFER TRANSFER MECHANISM

[75] Inventors: Takanobu Asano, Yokohama; Hirofumi Kitayama, Aikawa; Hiroyuki Iwai; Yuuji Ono, both of Sagamihara, all of Japan

[73] Assignee: Tokyo Electron Sagami Limited, Kanagawa, Japan

[21] Appl. No.: 550,981

[22] Filed: Jul. 11, 1990

[30] Foreign Application Priority Data

Jul. 17, 1989 [JP] Japan ................. 1-183927
Jul. 17, 1989 [JP] Japan ................. 1-183929
Mar. 9, 1990 [JP] Japan ................. 2-59155

[51] Int. Cl.$^5$ ............................... B23K 9/00
[52] U.S. Cl. ............................... 414/172; 414/217; 414/744.2; 414/753; 414/754; 414/331; 414/752; 414/416; 118/719; 204/298.25
[58] Field of Search ............... 187/17; 414/217, 222, 414/225, 226, 749, 750, 744.2, 744.6, 751, 752, 753, 754, 331, 172, 187, 150, 152, 160; 204/298.25; 118/500, 719, 719

[56] References Cited

U.S. PATENT DOCUMENTS

| | | | |
|---|---|---|---|
| 4,744,718 | 5/1988 | Kawabata | 414/416 X |
| 4,770,590 | 9/1988 | Hugues et al. | 414/172 |
| 4,775,281 | 10/1988 | Prentakis | 414/217 X |
| 4,790,750 | 12/1988 | Bourel et al. | 414/217 X |
| 4,802,809 | 2/1989 | Bonora et al. | 414/217 |
| 4,917,556 | 4/1990 | Stark et al. | 414/217 |
| 4,955,775 | 9/1990 | Ohkase et al. | 414/416 X |
| 4,962,726 | 10/1990 | Matsushita et al. | 414/217 X |
| 4,963,069 | 10/1990 | Wurst et al. | 414/416 |

FOREIGN PATENT DOCUMENTS

| | | |
|---|---|---|
| 60-231337 | 11/1985 | Japan. |
| 60-258459 | 12/1985 | Japan. |
| 61-54639 | 3/1986 | Japan. |
| 61-144821 | 7/1986 | Japan. |
| 8809303 | 12/1988 | PCT Int'l Appl. ............. 414/225 |

*Primary Examiner*—Frank E. Werner
*Attorney, Agent, or Firm*—Oblon, Spivak, McClelland, Maier & Neustadt

[57] ABSTRACT

A vertical heat-treatment apparatus is provided with a mechanism for automatically transferring semiconductor wafers from carriers to a boat for a vertical type furnace. The automatic transferring mechanism comprises a port for receiving a plurality of carriers arranged in series in an upright state, a posture change mechanism for changing the posture of wafers in the carriers from the upright state to the horizontal state, a parallel transfer mechanism for transferring the carriers on the boat to the posture change mechanism, a carrier loading/unloading mechanism for loading the carriers on a station, a wafer loading/unloading mechanism for taking out the wafers from the carriers on the station in turn and transferring the taken-out wafers to the boat in turn, and a mounting mechanism for mounting the boat in the furnace. The carrier loading/unloading mechanism and the wafer loading/unloading mechanism are mounted on a common frame and are rotated and lifted at the same time.

12 Claims, 12 Drawing Sheets

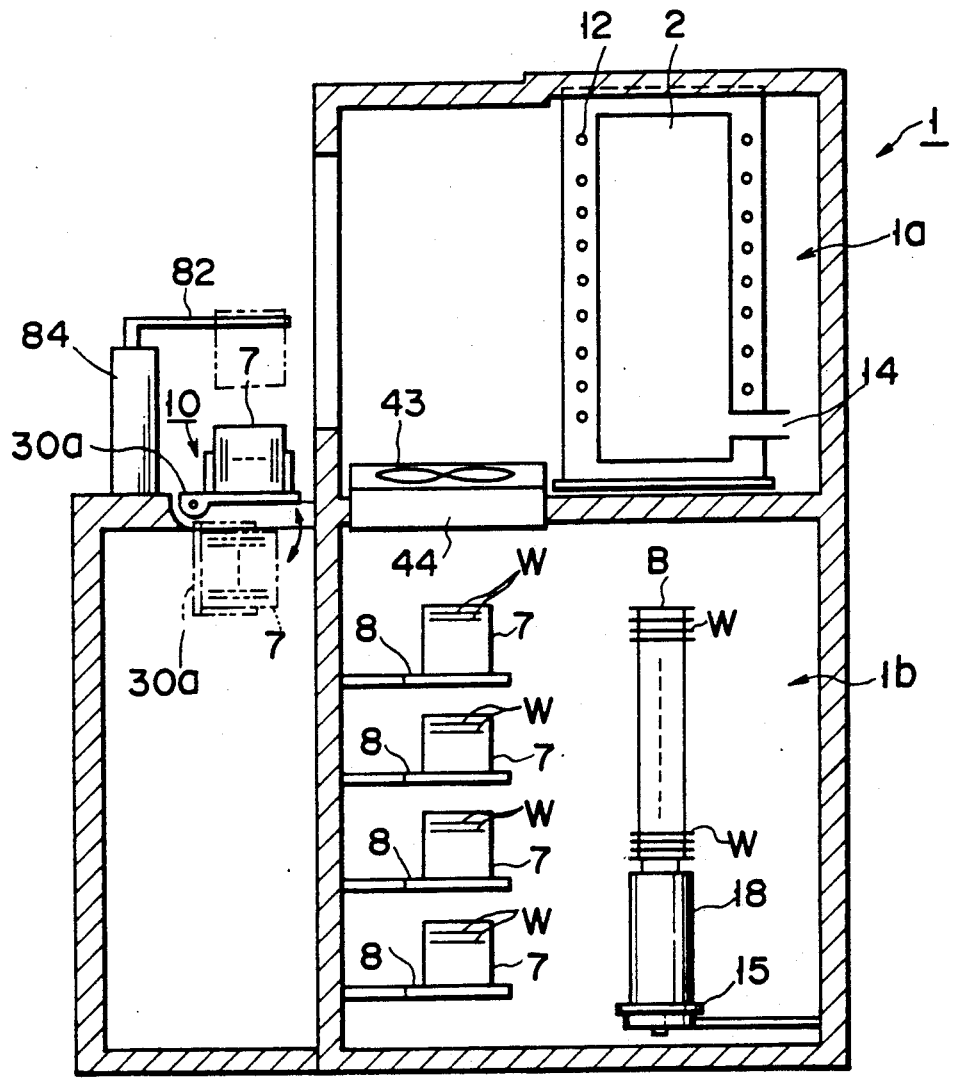
F I G. 1

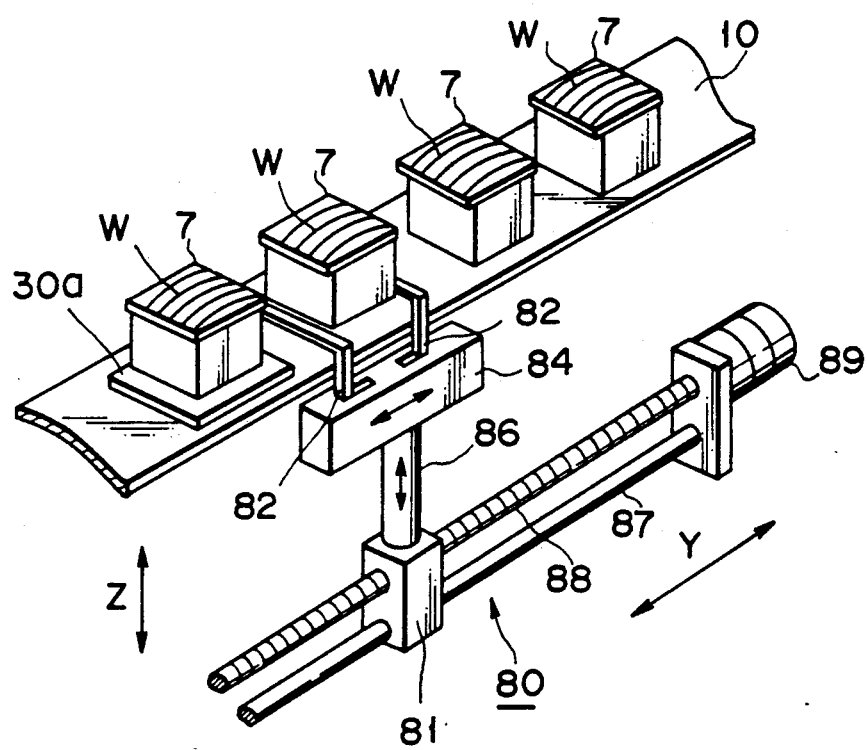
F I G. 4

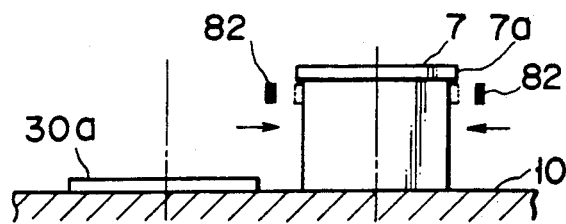
F I G. 5A
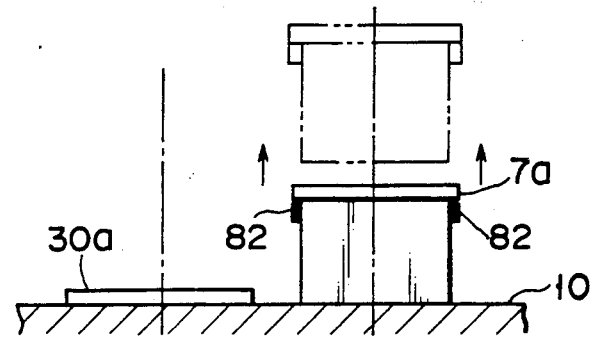
F I G. 5B
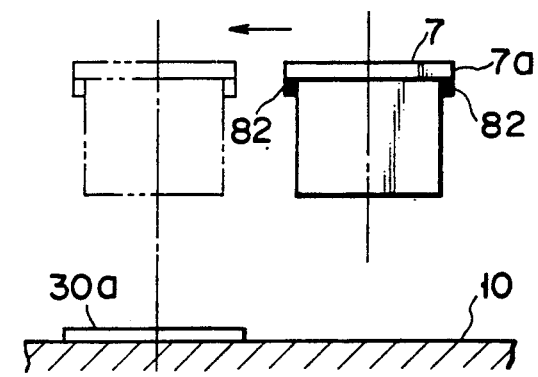
F I G. 5C
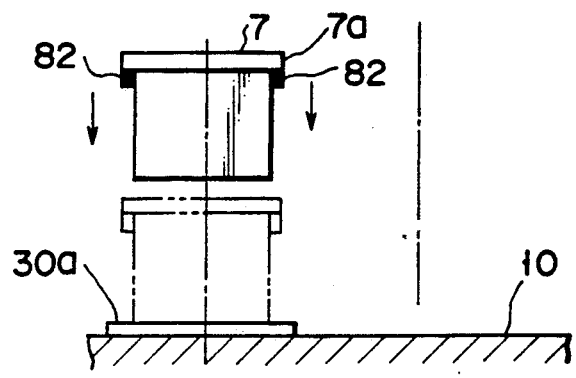
F I G. 5D

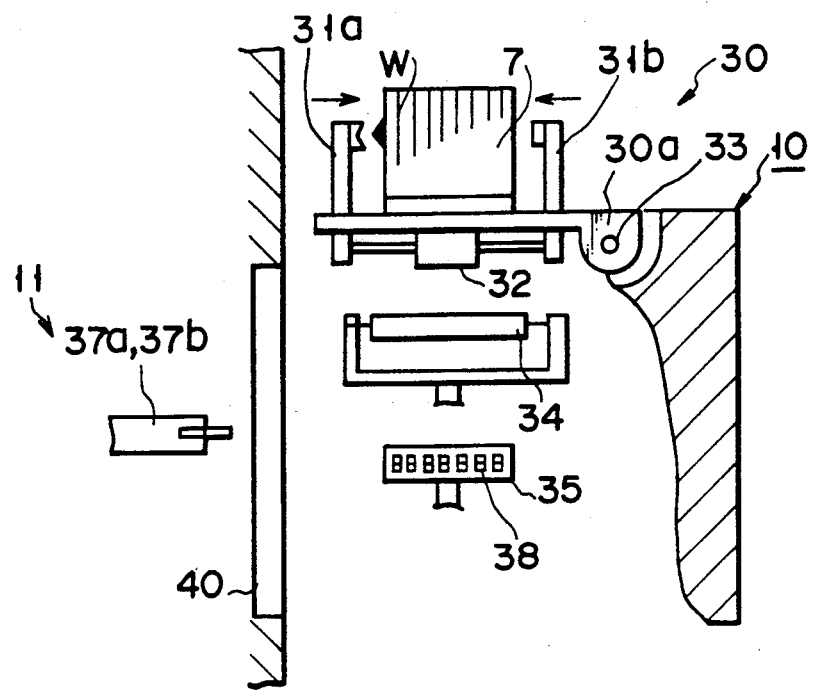
F I G. 6A
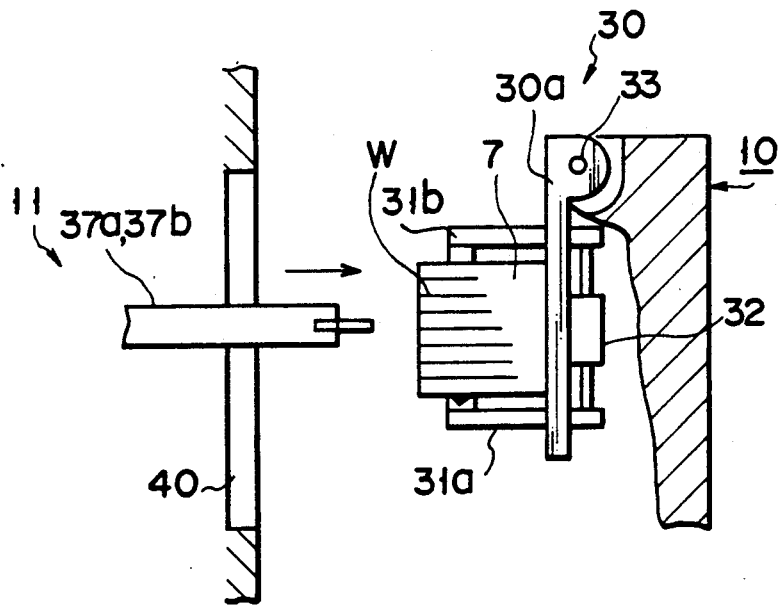
F I G. 6B

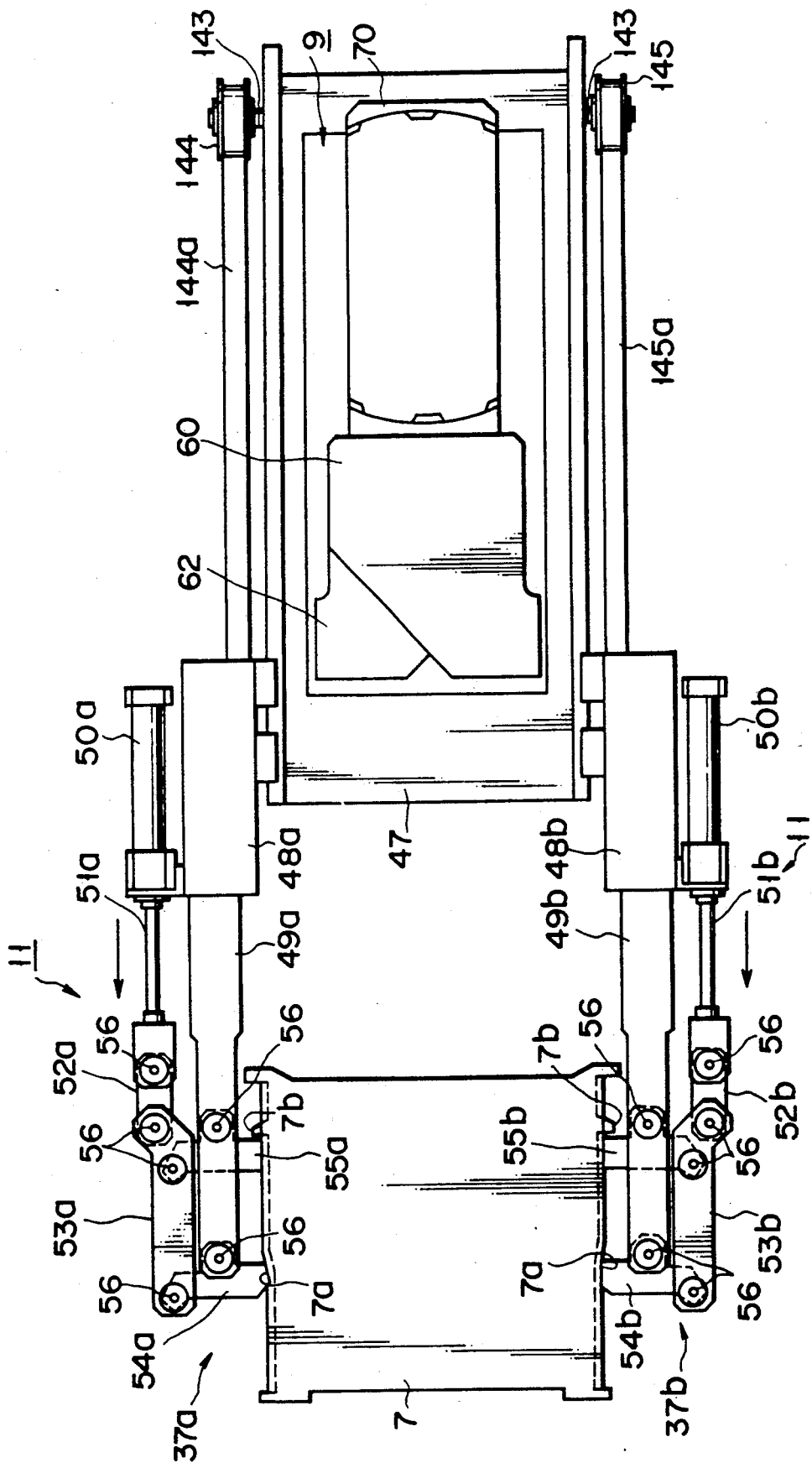
F I G. 7B

VERTICAL HEAT-TREATMENT APPARATUS HAVING A WAFER TRANSFER MECHANISM

BACKGROUND OF THE INVENTION

1. Field of the Invention

The present invention relates to a vertical heat-treatment apparatus and more particularly to a vertical heat-treatment apparatus having a wafer transfer mechanism for transferring semiconductor wafers between a carrier and a heat treatment boat.

2. Description of the Related Art

As unmanned control system and automation system have recently developed in a clean room, there has been visualized a system for transferring wafer carriers (cassettes) by means of pilotless transferring robots between machines for manufacturing semiconductor devices. For this purpose, a loading/unloading port for automatically transferring wafer carriers is provided in each manufacturing machine.

It is required that the space of the clean room be as small as possible in order to exhaust dust in the clean room in a short time so as to maintain a high degree of cleanness. Since a vertical heat-treatment furnace has a smaller floor space than a horizontal heat-treatment furnace, the employment of the vertical heat-treatment furnace allows for effective usage of the floor space. Further, the vertical heat-treatment furnace has an advantage that a wafer boat is transferred without contacting the inner wall of a reaction tube.

In the vertical heat-treatment furnace is provided a wafer transfer device for transferring semiconductor wafers from the carriers to the boat.

U.S. Pat. No. 4,770,590 discloses a wafer transfer mechanism for a vertical heat-treatment furnace. However, this wafer transfer mechanism is of a semi-automatic type so that an operator must manually set carriers on the station. At the time of this setting, undesirable dust enters the furnace and semiconductor wafers are contaminated, as a result increasing the fraction defective of the semiconductor devices.

Japanese Published Unexamined Patent Application No. 61-144821 discloses an automatic wafer transfer mechanism which automatically transfers wafers. With this mechanism, a transfer robot sets a single carrier on a station and wafers are transferred by means of a transfer device from the carrier to a boat. Since, after the transfer has been completed, the transfer robot must return the empty carrier to the station and set a new single carriage on the station, the transfer requires much time. Specifically, it takes about three minutes to transfer wafers from a carrier (accommodated twenty five wafers) to the boat. Therefore, for example, when wafers are transferred from six to eight carriers to the boat, it will take about twenty minutes to complete the transfer of the wafers to the boat. Since the transfer mechanism has a separate transfer robot, the mechanism has the demerit that it requires a large floor space in total. Further, the robot is expensive and its complicated structure leads to a lot of cost and time to maintain and check it.

SUMMARY OF THE INVENTION

The object of the present invention is to provide a vertical heat-treatment apparatus having a wafer transfer mechanism which fully automatically transfers semiconductor wafers between carriers and a boat, has a small floor space and is manufactured at a low cost.

According to an aspect of the present invention, there is provided a vertical heat-treatment apparatus having a wafer transfer mechanism for transferring a plurality of semiconductor wafers between one of carriers and a boat, the apparatus comprising a port for receiving the carriers, with the wafers arranged in parallel substantially in a vertical state, posture change means provided at the port for changing the posture of the wafers in the carriers from the horizontal state to the vertical state, carrier transfer means for transferring the carriers at the port to the attitude change means, a station for keeping the carriers in a standby state, with the wafers arranged in parallel substantially in a horizontal state, carrier loading/unloading means for receiving the carriers from the posture change means and transferring the carriers to and loading the same on a station, wafer loading/unloading means for taking out the wafers in succession from the carries on the station and transferring the taken-out wafers to and loading the same on the boat in turn, and boat mounting means for mounting the boat in a heat-treatment furnace. The carrier loading-/unloading means and the wafer loading/unloading means are mounted on a common frame.

It is preferred that the posture change means have a holding mechanism for holding carriers in order to prevent the carriers from dropping off during the posture change. In this case, the holding operation of the carrier holding mechanism may be controlled by a computer system so that the holding operation cooperates with the carrier receiving operation of the carrier loading/unloading mechanism.

The wafer loading/unloading means includes a wafer receiver which has fork members for taking out wafers from the carriers. It is desirable that the fork members comprise first fork members for taking out a plurality of wafers from a carrier and a second fork member for taking out a wafer from the carrier. In this case, the first and second fork members are operated independently. It is preferable that the driving mechanism of the fork members be a belt driving mechanism. However, the driving mechanism of other type is possible, if it is easily maintained and checked.

Preferably, the wafer receiver has a horizontality adjustment mechanism. By setting the fork members in an accurately horizontal state, wafers can be smoothly taken out from the waiting carrier on the station.

The carrier loading/unloading means has a pair of link mechanisms for holding a carrier. Preferably, the paired link mechanisms have four pawl members in total so as to hold carriers being transferred at four points. It is desirable to use air cylinders as the driving means of the link mechanisms. Instead, any other driving mechanisms may be used if they are light in weight and have a high response. Preferably, the link mechanisms are operated by a belt driving mechanism.

Further, it is preferred that a swivel mechanism be provided for rotating, in a vertical plane, the frame loaded with the carrier loading/unloading mechanism and the wafer loading/unloading mechanism.

Still further, it is desirable that a lift mechanism be provided for lifting and lowering the carrier loading-/unloading mechanism and the wafer loading/unloading mechanism. By lifting and lowering the frame, carriers can be loaded on multi-stations from which waiting carriers are taken out.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a longitudinal cross-section view of an overall vertical heat-treatment apparatus according to an embodiment of the present invention;

FIG. 4 is a perspective view of a mechanism for carrying out the parallel transfer of carriers;

FIGS. 5A to 5D show the movements of a carrier when the carrier on a stage is transferred to a carrier port by means of the mechanism for carrying out the parallel transfer of carriers;

FIGS. 6A to 6C show the operation of a carrier posture change mechanism and a carrier receiving mechanism when the carrier is transferred from the carrier port to the lower portion of the apparatus;

FIG. 7B is a plan view of the carrier receiving mechanism when it holds a carrier;

DETAILED DESCRIPTION OF THE PREFERRED EMBODIMENTS

Figure 2:
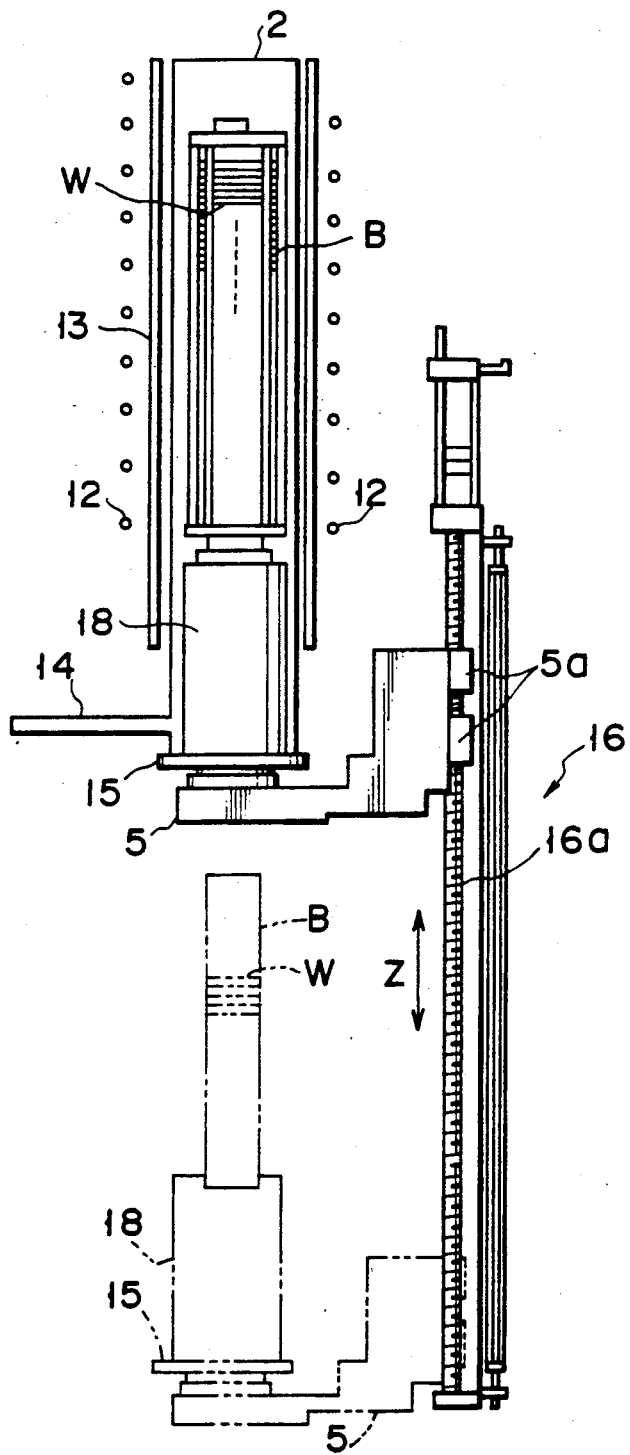
FIG. 2 is a partial transversal cross-sectional view of the main part of the vertical heat-treatment apparatus of FIG. 1.

This invention will be explained by way of an embodiment with reference to the accompanying drawings.

A vertical heat-treatment apparatus 1 is installed in an unmanned clean room and is fully automatically controlled by a computer system.

As shown in FIG. 1, the vertical heat-treatment apparatus 1 comprises a process section 1a and a wafer transfer section 1b. The process section 1a comprises the upper portion of the apparatus 1, and the wafer transfer section 1b comprises the lower portion of the apparatus 1. A fan 43 having a filter 44 is provided between the process section 1a and the wafer transfer section 1b. The fan 43 is disposed right above a carrier station 8 in the wafer transfer section 1b and supplies clean air to the station 8 when wafers W are transferred. As the filter 44, an HEPA filter or a ULPA filter is used.

Figure 3:
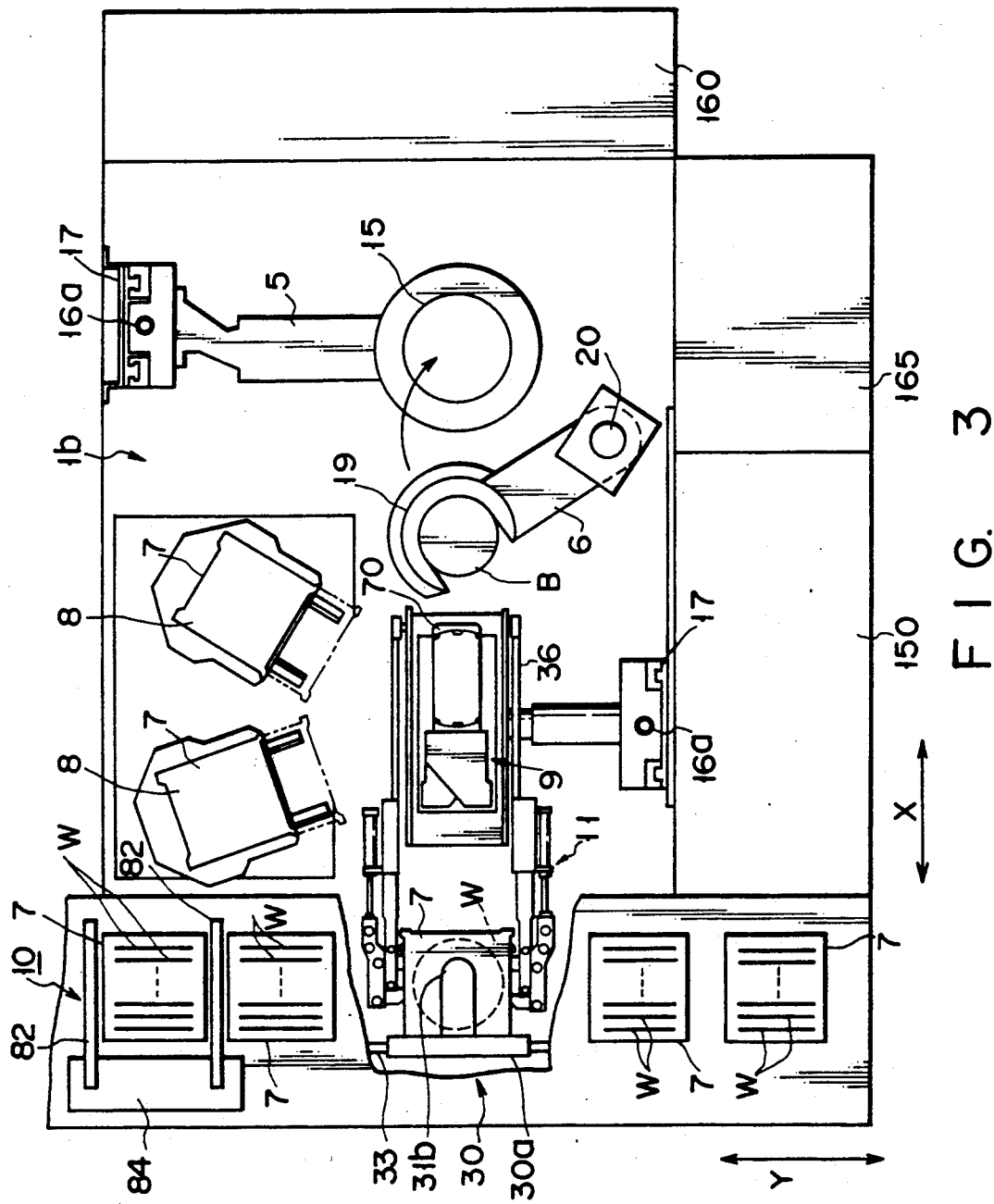
FIG. 3 is a plan view of a wafer transfer device in the lower portion of the apparatus.

Referring to FIG. 3, a carrier port 10, a process control section 150, a process gas supplying section 165 and an evacuating section 160 are provided adjacent to the wafer transfer section 1b. The carrier port 10 is provided on the front face of the wafer transfer section 1b and extends along a Y axis. A plurality of carriers 7 are arranged at equal intervals on the carrier port 10. The movable base 30a of a carrier posture change mechanism 30 is supported on the central portion of the port 10 by means of a horizontal support shaft 33. A parallel transfer mechanism 80 is mounted on the front face of the wafer transfer section 1b.

Figure 6C:
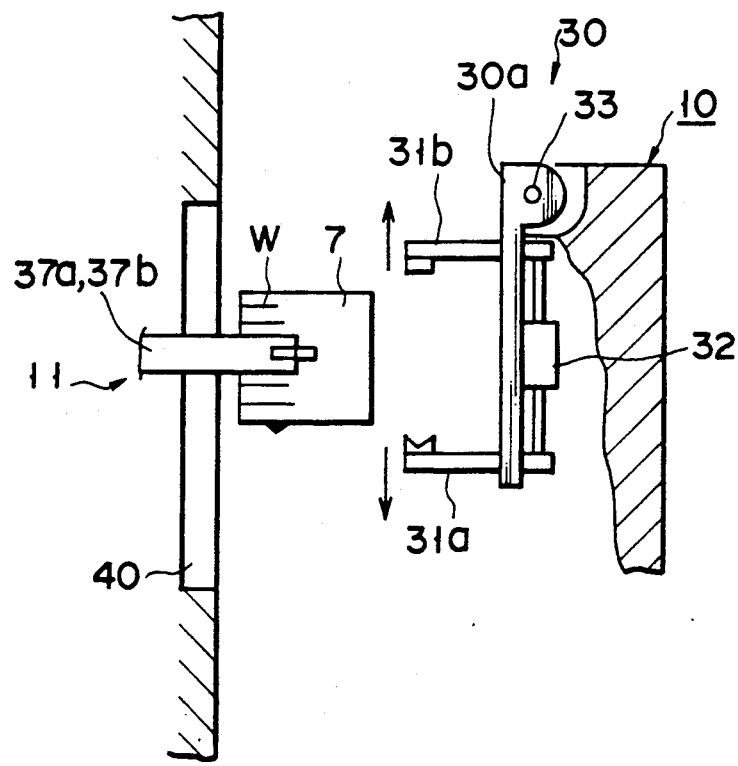

As shown in FIGS. 6A to 6C, the port 10 is formed with an opening so that the movable base 30a can be rotated about the shaft 33 between the horizontal state and the vertical state at the opening of the port 10.

In the process section 1a is housed a process tube 2 bounded by a coil heater 12. The upper end of the tube 2 is closed and the lower end thereof is opened. The lower opening of the tube 2 communicates with the wafer transfer section 1b.

In FIG. 2, a lid member 15 is disposed right under the lower opening of the process tube 2. On the lid member 15 is placed a heat insulating cylindrical member 18 on which a vertical boat B is disposed. The lid member 15 is carried by a support member 5, and nuts 5a of the support member 5 mesh with the ball screw 16a of a lift mechanism 16. The lid member 15 has a larger diameter than the lower opening of the process tube 2.

A process gas supplying tube (not shown) extends vertically along the inner peripheral wall of the tube 2 and is connected to a gas supplying source (not shown) via a mass-flow controller (not shown). An air exhaust tube 14 extends from the lower portion of the tube 2 and is connected to the suction port of a vacuum pump (not shown). Between the process tube 2 and the coil heater 12 is disposed a heat equalizing tube 13 for rendering the temperature distribution in the tube 2 uniform.

The parallel transfer mechanism 80 will now be explained with reference to FIG. 4.

A truck (not shown) on which a robot runs is laid in front of the carrier port 10. The robot (not shown) transports carriers 7 from a predetermined place to the port 10 and loads them thereon. The parallel transfer mechanism 80 is provided on the front face of the carrier port 10 and has a ball screw 88 and a linear guide 87 extending along the Y axis so as to pass through a movable member 81. One end of the ball screw 88 is connected to the driving shaft of a motor 89.

The movable member 81 contains a nut and a lift cylinder (neither shown), and the nut meshes with the ball screw 88. To the upper end portion of the cylinder rod 86 of the lift cylinder is fixed a chuck mechanism 84 which has a pair of arms 82 connected to the rod (not shown) of an air cylinder. The air cylinder for driving the arms 82 is provided along the Y axis.

Referring to FIGS. 6A to 6C, there will now be explained the carrier posture change mechanism 30.

The support shaft 33 is connected to a rotary drive mechanism (not shown) which has a lock mechanism for preventing rotation and a return mechanism. The driving system of the lock mechanism and the return mechanism is connected to that of the air cylinder 32 of clamps 31a and 31b via an automatic control circuit so as to cooperate therewith.

As shown in FIG. 6A, when the clamps 31a and 31b open, the lock mechanism operates to cause the movable base 30a to be held horizontally by the support shaft 30.

On the other hand, when the clamps 31a and 31b are closed as shown in FIG. 6B, the lock mechanism is released and the support shaft 33 is rotated counter-clockwise to cause the movable base 30a to take a vertical state.

After the clamps 31a and 31b have opened again as shown in FIG. 6C, the return mechanism operates to cause the support shaft 33 to rotate reversely so that the movable base 30a returns to the horizontal state.

A rotary roller 34 is provided right under the movable base 30a. The roller 34 is supported by a moving mechanism and is moved thereby so as to abut against the end faces of the wafer w exposed at the bottom of the carrier 7. The contact of the wafers W with the roller 34 allows the orientation flats of the wafers W in the carrier 7 to align with each other.

A wafer counter 35 is provided at the vicinity of the roller 34. The wafer counter 35 is also supported by the moving mechanism (not shown) and can be moved by it to a position close to a position right under the carriers 7. The wafer counter 35 has emitting/receiving photo sensors 38 and counts the number of wafers W by radiating the wafers W in the carrier 7 with light.

The carrier loading/unloading mechanism 11 will be explained with reference to FIGS. 7A and 7B.

Figure 9:
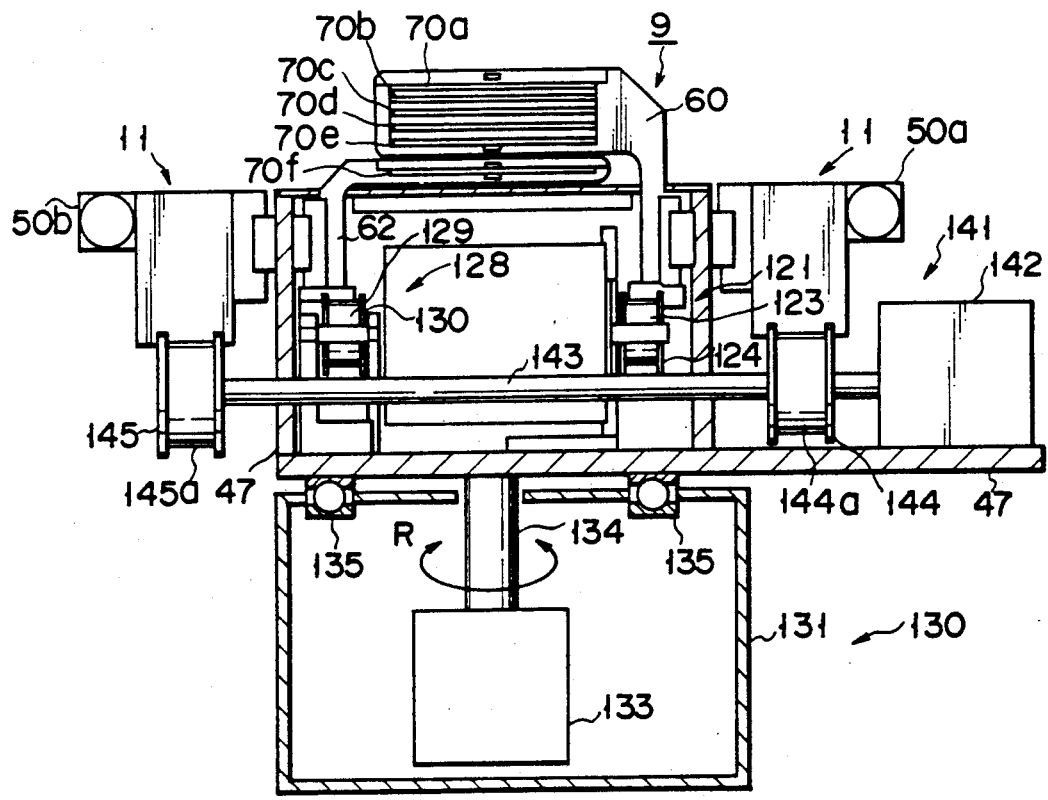
FIG. 9 is a transversal cross-sectional view of the wafer loading/unloading mechanism.

The carrier loading/unloading mechanism 11 and a wafer loading/unloading mechanism 9 are formed unitarily. This unitary assembly is supported by a rotary shaft 134 so as to be rotatable therearound as shown in FIG. 9 and to be lifted or lowered along the ball screw 16a in the directions along the Y axis as shown in FIG. 3.

The carrier loading/unloading mechanism 11 has a pair of links 37a and 37b opposed to each other. They are in a mirror image relationship. Thus, only one link 37a is explained for convenience. A main member 48a is fixed to a side portion of the front face of a main body frame 47. A fixed arm 49a is attached to the front end of the main body 48a, and a cylinder 50a is fixed to a lateral wall of the main member 48a.

The cylinder 50a drives a movable arm comprising a short arm 52a, a long arm 53a, a first pawl member 54a, a second pawl member 55a and pins 56, and extending along the fixed arm 49a at its outside. One end of the short arm 52a is connected to the forward end of the rod 51a of the cylinder 50a by means of a pin 56, and one end of the long arm 43a is connected to the other end of the short arm 52a by means of another pin 56. The first pawl member 54a is connected to the forward end of the long arm 53a by means of a further pin 56, and the second pawl member 55a is connected to the long arm 53a at the vicinity of its rear end by means of a still further pin 56. The other ends of the first and second pawl members 54a and 55a are connected to the appropriate portions of the fixed arm 49a by means of other pins 56.

It should be understood that the elements having reference numerals bearing a of the link 37a are replaced by the elements having the same reference numerals bearing b when the reference will made to the link 37b.

Figure 7A:
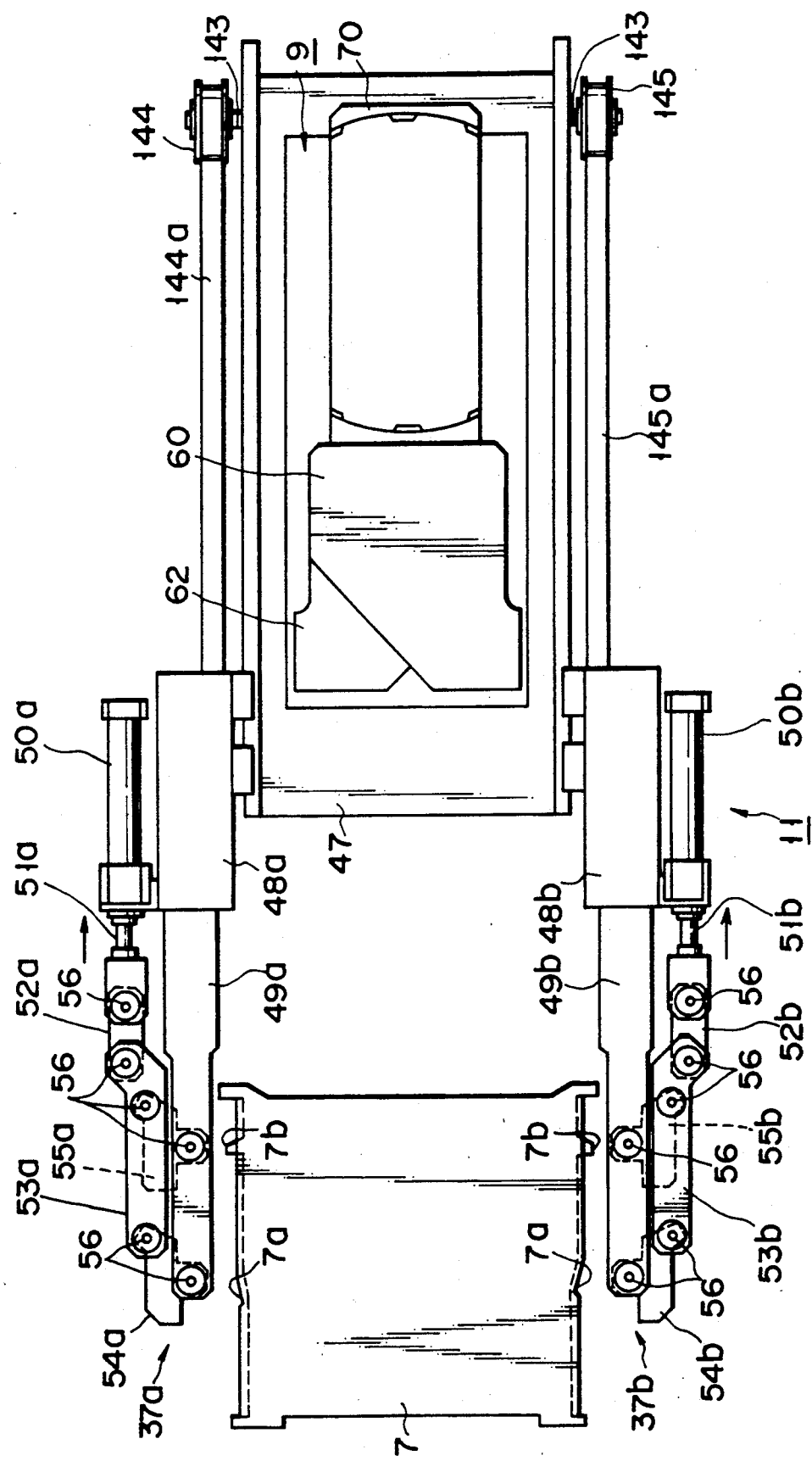
FIG. 7A is a plan view of the carrier receiving mechanism when it does not hold a carrier.

When the link 37a which is constructed as above-mentioned is retracted in the cylinder 50a, the forward ends of the first and second pawl members 54a and 55a are directed in the lengthwise direction of the fixed arm 49a, as shown in FIG. 7A.

On the other hand, when the rod 51a is extended from the cylinder 50a, the forward ends of the first and second pawl members 54a and 55a are rotated so that they are directed towards the direction perpendicular to the lengthwise direction of the fixed arm 49a. The carrier 7 is formed with a depression 7a and a stop 7b at its side wall. The relative position between the carrier 7 and the carrier loading/unloading mechanism 11 is adjusted by matching first pawl member 54a and the second pawl member 55a to the depression 7a and the stop 7b, respectively.

Referring to FIGS. 8 to 12, the wafer loading/unloading mechanism 9 will now be explained in detail.

Two kinds of forks consisting of a set of five forks 70a to 70e and a fork 70f and made of aluminum alloy are provided on the frame 47 of the wafer loading/unloading mechanism 9 and are supported by support members 60 and 62, respectively, so that they are driven separately by means of belt driving mechanisms 121 and 128, respectively. The forks 70a to 70f may be made of alumina, SiC or quartz instead of aluminum alloy.

Figure 8:
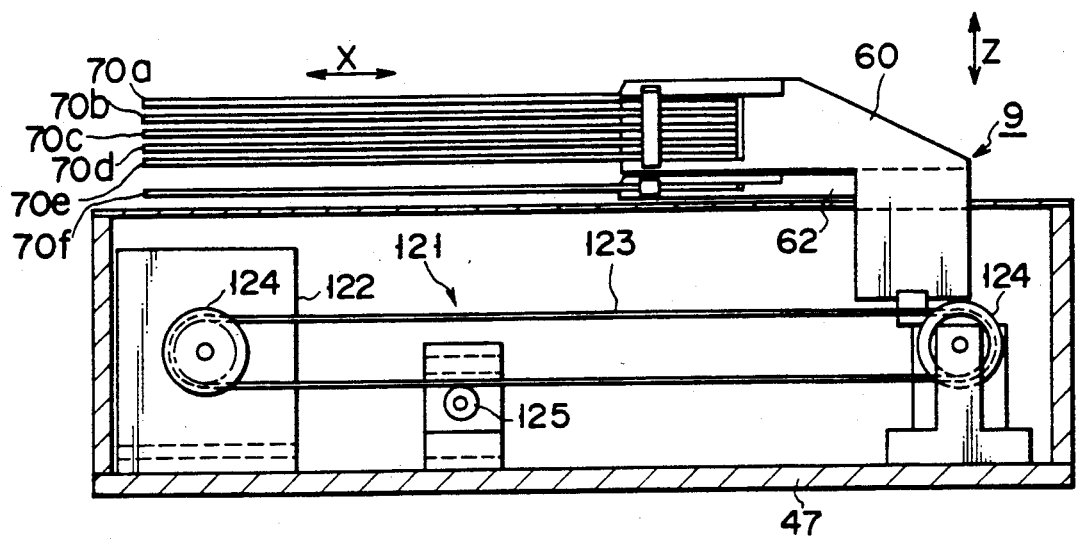
FIG. 8 is a longitudinal cross-sectional view of a wafer loading/unloading mechanism.

As shown in FIG. 8, the driving mechanism 121 for the set of five forks 70a to 70e comprises a timing belt 123 stretched between a pair of pulleys 124, a motor 122 connected to one of the pulleys 124 and an idler wheel 125. The other belt driving mechanism 128 has the similar structure to the belt driving mechanism 121.

In FIG. 9, the frame 131 of the swivel mechanism 130 is mounted on the bottom of the frame 47 via bearings 135. A step motor is used as a motor 133 of the swivel mechanism 130 and the rotation of the shaft 134 of the motor 133 is automatically controlled by the computer system.

The carrier loading/unloading mechanism 11 is moved by an X axis driving mechanism 141 of a belt driving type in the directions of the X axis. The motor 142 of the X axis driving mechanism 141 is fixed to the frame 47, and a motor driving shaft 143 is connected to pulleys 144 and 145.

Figure 10:
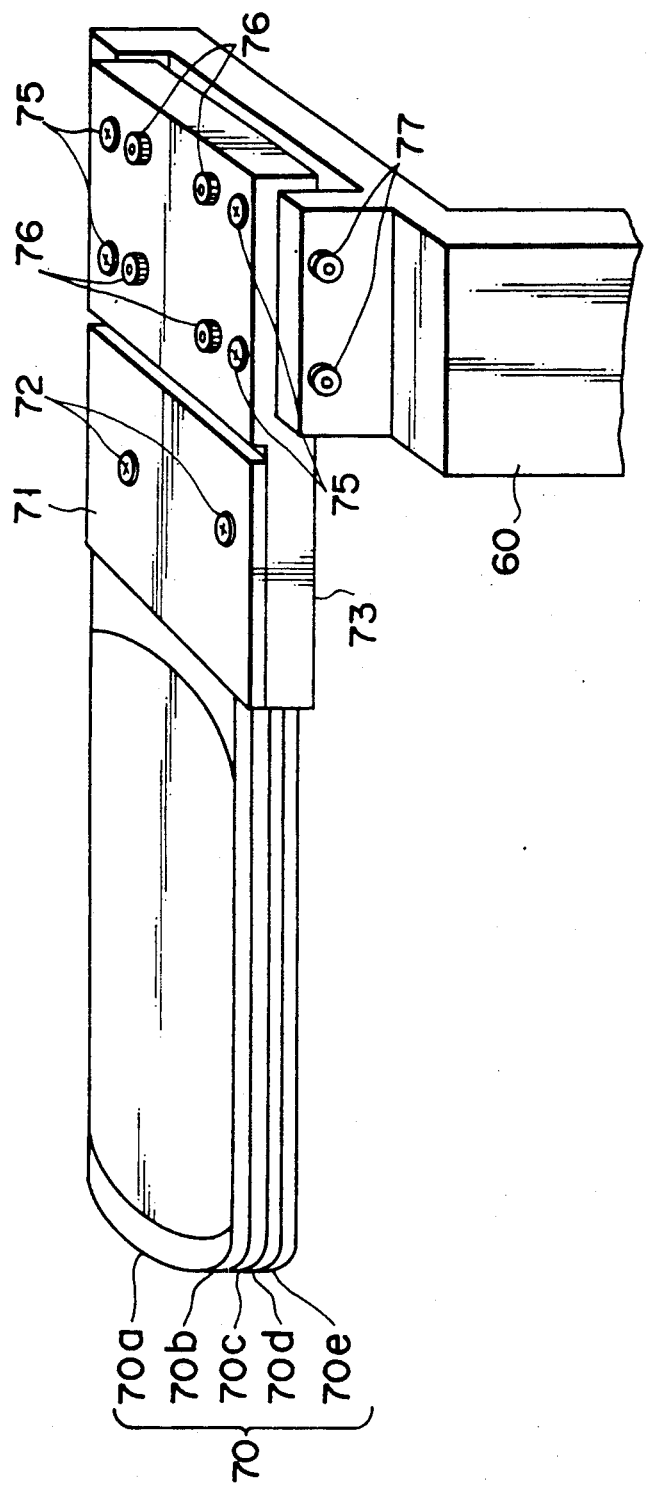
FIG. 10 is a perspective view of the forks of the wafer loading/unloading mechanism.
Figure 11:
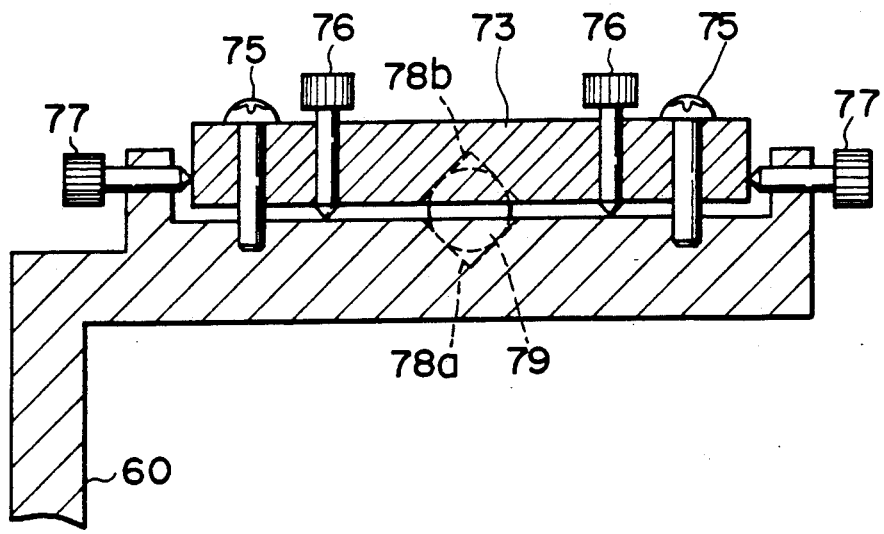
FIG. 11 is a transversal cross-sectional view of the wafer loading/unloading mechanism.

As shown in FIGS. 10 and 11, the set of five forks 70a to 70e of the wafer loading/unloading mechanism 9 are placed between a base 73 and a plate 71 and fixed by screws 72 so as to be arranged at equal intervals. A ball 79 is placed in depressions 78a and 78b formed in the opposed faces of the support member 60 and the base 73, and the position of the base 73 as well as the positions of the forks 70a to 70e can be changed by means of first and second adjustment screws 76 and 77. Specifically, the horizontal and vertical positions of the tips of the forks 70a to 70e are adjusted by means of the four first adjustment screws 76, and the rotational position of the tips of the forks 70a to 70e is adjusted by means of the four second adjustment screws 77. Fixing screws 75 fix the base 73 to the support member 60.

Figure 12:
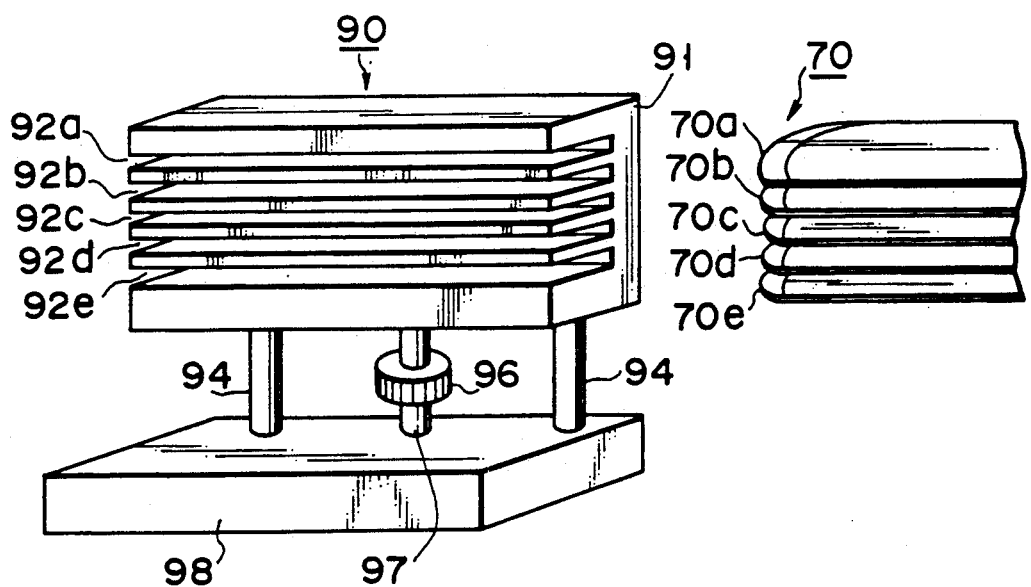
FIG. 12 is a perspective view of part of the forks of the wafer loading/unloading mechanism and a wafer position adjusting groove member.

Referring to FIG. 12, the degree of parallelism of the forks 70a to 70e are adjusted by means of an adjustment member 90 which has horizontal grooves 92a to 92e spaced at equal vertical intervals. Upon loosening the fixing screws 72 and 75 and the adjustment screws 76 and 77, the forks 70a to 70e are inserted in the respective grooves 92a to 92e and the parallelism of the forks 70a to 70b is adjusted.

There will now be explained how to transfer semiconductor wafers W from the carriers 7 to the boat B.

(I) Carriers 7 are loaded and arranged on the port 10 in succession by a robot. The transfer condition and the heat-treatment condition are input to a CPU of the computer system at a keyboard.

(II) The command signals from the CPU are supplied to the parallel transfer mechanism 80 and operates it. As shown in FIGS. 5A to 5D, the carrier 7 is held by the paired arms 82 and is loaded on the movable base 30a.

(III) The carrier 7 is held by the arms 31a and 31b the carrier posture change mechanism 30. Since the arm 31a has a stronger locking force than the arm 31b, the arm 31a is set in position with respect to the carrier 7 before the arm 31b is set. Then, the roller 34 is caused to contact the wafers W in the carrier 7 to align the orientation flats of wafers. Next, the number of the wafers W in the carrier 7 is counted by the wafer counter 35. After unlocking, the shaft 33 is rotated counterclockwise to rotate the carrier 7 as well as movable base 30a through 90 degrees. As shown in FIG. 6B, the wafers W in the carrier 7 take a horizontal position.

(IV) The carrier loading/unloading mechanism 11 is advanced towards the carrier 7, and the links 37a and 37b are positioned at the sides of the carrier 7. Thereafter, the rods 51a and 51b are projected from the cylinders 50a and 50b. The tips of the second pawl members 55a and 55b contact the stops 7b of the carrier 7 and the carrier loading/unloading mechanisms 11 and the carrier 7 are set in position. As shown in FIG. 7B, the tips of the first pawl members 54a and 54b are fitted in the depressions 7a of the carrier 7, whereby the carrier 7 is held by the links 37a and 37b.

(V) After the arms 31b of the carrier posture change mechanism 30 are unlocked, the arms 31a are also unlocked. Then, the carrier loading/unloading mechanism 11 is retracted in the wafer transfer section 1b and is rotated to the carrier station 8. Then, the mechanism 11 is elevated to position the carrier 7. The rods 51a and 51b are retracted in the cylinders 50a and 50b, and then the links 37a and 37b are unlocked. The carrier 7 is loaded on the carrier station 8.

With this embodiment, the carrier station 8 has four stories, each of which has two compartments. Each compartment of the carrier station 8 is provided with a sensor (not shown) for detecting the carrier 7. The compartments of the carrier station 8 in which the carriers 7 are received are previously programmed. While the wafers W are not transferred from carriers to the boat B, the carriers on the port 10 are transferred to the carrier station 8 in succession.

(VI) The boat B enters the wafer transfer section 1b through an inlet (not shown) and is set at a predetermined waiting position.

By actuating the swivel mechanism 130, the carrier loading/unloading mechanism 11 and the wafer loading/unloading mechanism 9 are replaced from each other, and the forks 70a to 70e are caused to face the openings of the carrier 7. By the drive of the belt, the forks 70a to 70e are advanced, and, after the tips of the forks have been inserted in the carrier 7, the forks 70a to 70e stop at predetermined position. The forks 70a to 70e are raised a little and pick up five wafers W in the carrier 7.

(VII) The forks 70a to 70e are retracted and rotated to face the boat B. The fork 70a to 70b are advanced again to insert the wafers W in the boat B and are lowered. By doing so, the five wafers W are transferred from the forks 70a to 70e to the boat B.

(VIII) After the loading of the wafers W on the boat B has been completed, the boat holding mechanism 6 is turned about the shaft 20 to load the boat B on the lid member 15.

(IX) The boat B is lifted by means of the lift mechanism 16 and is mounted in the reaction tube 2. The lower opening of the reaction tube 2 is blocked by the lid member 15. Thereafter, the reaction tube 2 is heated by the heater 12 such that the wafers W loaded on the boat B is heat-treated at a required temperature. After the heat treatment, the processes are reversed to transfer the wafers W from the boat B to the carrier 7.

With the embodiment, the mounting of the carrier loading/unloading mechanism 11 and the wafer loading/unloading mechanism 9 on the common frame makes not only the heat-treatment apparatus smaller than the conventional apparatus but also the floor space of the wafer transfer section 1b smaller than the conventional one.

Further, since the carrier posture change mechanism 30 is provided on the port 10, the position of the carrier 7 as well as the wafers W need not be changed from the vertical state to the horizontal state by the carrier loading/unloading mechanism 11 or the wafer loading/unloading mechanism 9, making the structure of the loading/unloading mechanisms 9 and 11 simple.

Finally, the present invention has the advantages that, since the wafers W are automatically handled in an unmanned state after the carriers transported by a robot from the exterior of the apparatus is received in the apparatus, the amount of dust which enters the process section is greatly reduced and the fraction defective of the semiconductor devices are lowered.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A vertical heat-treatment apparatus having a wafer transfer mechanism for transferring a plurality of semiconductor wafers from a plurality of carriers to a vertical boat, said apparatus comprising:

a port having a substantially horizontal surface for receiving said carriers, said wafers being arranged in parallel substantially in a vertical state in said carriers;

posture change means provided at said port for rotating said carriers to change the posture of said wafers from said vertical state to a horizontal state;

a station for keeping said carriers in a standby state, with said wafers arranged in parallel substantially in said horizontal state;

carrier loading/unloading means for receiving said carriers from said posture change means and transferring said carriers to and loading the same on said station; and wafer loading/unloading means for taking out said wafers in succession from said carriers on said station and transferring said wafers to said vertical boat and loading said wafers on said vertical boat;

a frame on which said carrier loading/unloading means and said wafer loading/unloading means are commonly mounted, and motive means for moving said frame between a first position and a second position, wherein said carrier loading/unloading means is presented toward said station when said movable frame is in said first position, and wherein said wafer loading/unloading means is presented toward said station when said movable frame is in said second position.

2. The apparatus according to claim 1, further comprising a control means, wherein said posture change means comprises a holding mechanism for holding said carriers while said carriers are rotated, said holding mechanism being controlled by said control means in cooperation with said carrier loading/unloading mechanism.

3. The apparatus according to claim 1, wherein said wafer loading/unloading means has a plurality of fork members for simultaneously taking out a plurality of said wafers from a corresponding one of said carriers.

4. The apparatus according to claim 1, wherein said wafer loading/unloading means has a plurality of first fork members supported on a first support member for simultaneously picking up a plurality of said wafers from one of said carriers at the same time and a second fork member supported on a second support member for picking up one of said wafers from said carrier, and a mechanism for moving said first and said second support members independently.

5. The apparatus according to claim 1, wherein said wafer loading/unloading means has at least one fork member for picking up said wafers from said carriers and a mechanism for adjusting a horizontal orientation of said fork members.

6. The apparatus according to claim 1, wherein said carrier loading/unloading means has a pair of link mechanisms for holding one of said carriers therebetween.

7. The apparatus according to claim 6, wherein said carrier loading/unloading means has a belt driving mechanism mounted on said frame for moving said link mechanisms relative to said frame.

8. The apparatus according to claim 1, wherein said wafer loading/unloading means has fork members which can be advanced into one of said carriers between said wafers to pick up said wafers, and said wafer loading/unloading means has a belt driving means for advancing said fork members.

9. The apparatus according to claim 1, further comprising a swivel mechanism rotatably supporting said frame in a horizontal plane.

10. The apparatus according to claim 1, further comprising a lifting means for lifting and lowering said frame.

11. The apparatus according to claim 1, further comprising carrier transfer means for transferring said carriers on said port to said posture change means.

12. The apparatus according to claim 1, further comprising a vertical-type furnace and a lifting means for lifting said vertical boat into said furnace.

* * * * *